United States Patent [19]

Bühne et al.

[11] 4,303,482

[45] Dec. 1, 1981

[54] APPARATUS AND METHOD FOR SELECTIVE ELECTROCHEMICAL ETCHING

[75] Inventors: Joachim Bühne, Heimsheim; Rolf Schäfer, Gärtringen-Rohrau; Axel Stoffel, Gültingen, all of Fed. Rep. of Germany

[73] Assignee: International Business Machines Corporation, Armonk, N.Y.

[21] Appl. No.: 143,661

[22] Filed: Apr. 25, 1980

[30] Foreign Application Priority Data

Feb. 5, 1979 [DE] Fed. Rep. of Germany ....... 2917654

[51] Int. Cl.³ .......................... C25F 3/12; C25F 7/00
[52] U.S. Cl. ......................... 204/129.3; 204/129.43; 204/129.65; 204/129.75; 204/224 M; 204/228; 204/DIG. 9
[58] Field of Search ............. 204/129.1, 129.25, 129.3, 204/129.43, 129.6, 129.65, 129.75, 224 M, 224 R, 228, DIG. 9

[56] References Cited

U.S. PATENT DOCUMENTS

| | | | |
|---|---|---|---|
| 2,656,496 | 10/1953 | Sparks | 204/129.3 X |
| 3,265,599 | 8/1966 | Soonpaa | 204/129.3 |
| 3,268,781 | 8/1966 | Lecan et al. | 204/129.3 X |
| 3,325,384 | 6/1967 | Frantzen | 204/129.65 X |
| 3,536,600 | 10/1970 | Van Dijk et al. | 204/129.3 |
| 4,002,511 | 1/1977 | Magdo et al. | 148/187 |
| 4,069,121 | 1/1978 | Baud et al. | 204/224 R X |
| 4,180,439 | 12/1979 | Deines et al. | 204/129.3 X |
| 4,197,142 | 4/1980 | Bozler et al. | 204/129.1 X |

OTHER PUBLICATIONS

Keyes, R. W., "Electrolytic Machining of Ink Jet Nozzles", IBM Tech. Discl. Bulletin, vol. 20, No. 7, Dec. 1977, p. 2912.
Hoare, J. P. et al., "Electrochemical Machining", Sci. Amer., Jan. 1974, p. 30.
Cutillo, J. G. et al., "Evaluating Electrochemical Baths", IBM Tech. Discl. Bul., vol. 13, No. 3, Aug. 1970, p. 726.
Potemski, R. M., "Anodic Angle Etching", IBM Tech. Discl., vol. 18, No. 4, Sep. 1975, p. 1223.

Primary Examiner—Delbert E. Gantz
Assistant Examiner—Donald R. Valentine
Attorney, Agent, or Firm—Michael J. Weins; Bernard N. Wiener

[57] ABSTRACT

An apparatus and method for selectively electrochemically etching a surface is described. The use of the apparatus and the related method allows the establishment of etched planar surface which may be inclined with respect to the original surface.

The apparatus has a cathode and multiple connectors which attach to the workpiece whose surface is to be etched. When the apparatus is operated the potential of the connectors are set so that the cathode is at least as negative as the lowest potential of the connectors.

11 Claims, 10 Drawing Figures

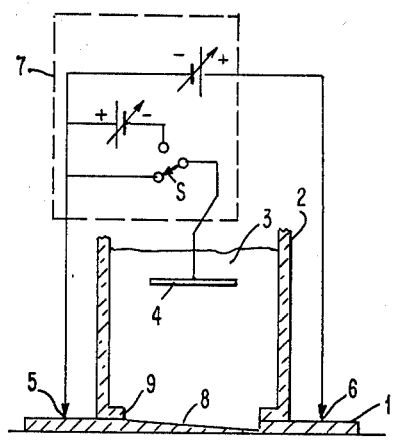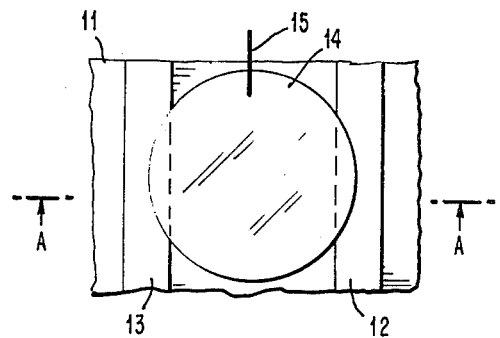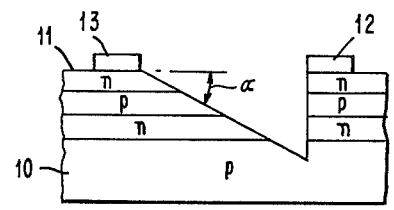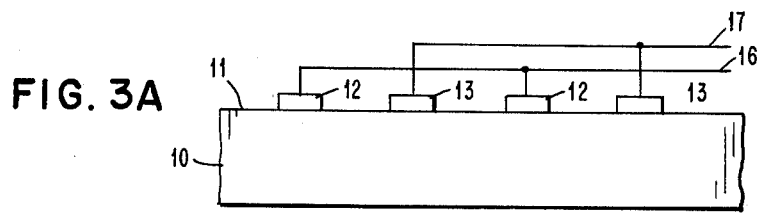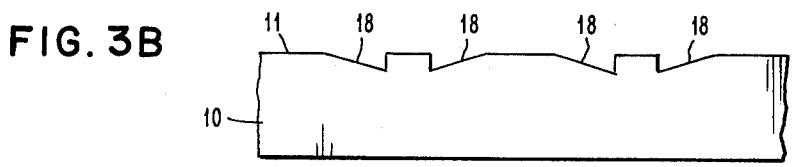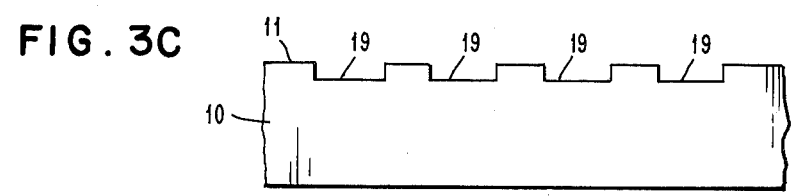

APPARATUS AND METHOD FOR SELECTIVE ELECTROCHEMICAL ETCHING

TECHNICAL FIELD

The invention relates to an apparatus and method for selectively electrochemically etching the surface of a workpiece, and more particularly to a method for etching planar surfaces which may be inclined to the original surface.

BACKGROUND ART

Various methods are known for the selective electrochemical etching of materials. According to these methods, the workpiece whose surface is to be etched is generally made the anode and contacted with the electrolyte into which the cathode is immersed. A surface can be selectively etched by limiting the contact of the electrolyte to only those areas of the surface that are to be etched. This can be achieved by covering the surface areas which are not to be etched with a suitable masking material, or by limiting the electrolyte contact to only the surface areas to be etched. The latter technique is described in German Offenlegungsschrift No. 2 707 372, and in IBM Technical Disclosure Bulletin, Volume 20, Number 7, December 1977, page 2912. Another method employed to selectively etch a surface is to locally vary the current density over the surface thereby varying the etching rate. This technique makes it possible to etch recesses with complex profiles in the etched surface. Locally different current densities can be produced by having the surface profile of the cathode correspond to the contour of indentation which is to be made in the etched surface. An article describing the details of this method is published in Scientific American, December 1974, page 30. By using this technique which employs contoured cathodes it is possible to make recesses with sides which are substantially vertical, horizontal, or inclined with respect to the original surface. A method for producing walls inclined with respect to the original surface is described in IBM Technical Disclosure Bulletin, Volume 13, Number 3, August 1970, page 726. The change in etching speed or current density which is necessary for producing the inclined plane is achieved by having the cathode designed as a plate which forms an acute angle with the surface to be etched. Another method for etching planes inclined with respect to the original surface is taught in IBM Technical Disclosure Bulletin, Volume 18, Number 4, September 1975, page 1223. Here the surface to be etched is pulled out of the electrolyte at a preselected speed. This results in the time for the etching process to vary in the pulling direction and consequently there is a variation in the quantity of the material removed as a function of distance.

The above-mentioned methods of etching planes inclined with respect to the original surfaces have the disadvantage that it is difficult to precisely and reproducibly obtain an angle of predetermined inclination. This problem is particularly true when producing very small inclinations which are required in the semiconductor devices. Inclined planes with a precisely defined angle of inclination are required in some doped semiconductors. The p- and n-conductive areas in semiconductor chips which have been doped by means of diffusion or ion implantation are characterized by a distribution of the doping atoms that vary as a function of penetration depth. The term penetration depth refers to the distance from the semiconductor surface, and the doping profile is the doping substance concentration plotted against the distance from the semiconductor surface.

Since the penetration depths are in the $\mu$m range, it is obvious that it is difficult to precisely measure the penetration depth or the change in doping concentration as a function of the distance from the semiconductor surface on a vertical cut through the semiconductor. These measurements are usually made by grinding a bevelled surface onto the doped material. In this way, the penetration depth and the distances to the semiconductor surface are expanded by the factor $1/\sin \alpha$, the angle $\alpha$ being the acute angle which is formed by the bevelled plane with the semiconductor surface. It is then possible to determine the penetration depth on the bevelled plane by a staining method, and the doping profile by a stopwise measurement of the resistance along the line of steepest gradient in the bevelled plane. As the angle $\alpha$ is decreased, these measurements can be made more accurately. When the penetration depth is reduced, and the doped areas which are more shallow are used, the same degree of precision is ensured by reducing the angle $\alpha$. As one makes smaller and smaller devices there is a need to reduce the angle to maintain the same accuracy in the measurements. The problem of making very small angles is that using existing techniques there is a rounding of the bevelled plane which results in inaccuracies in the measured penetration depths and doping profiles. For precise reproducible measuring, it is both necessary to produce a sufficiently small angle $\alpha$, and said angle must be made in a reproducible manner. When the inclined surfaces are ground, it is difficult to make reproducible surfaces of a uniformly high quality.

Variations in the surface quality can affect the measuring depth. To avoid the disadvantages of the grinding technique it would be of advantage to use an etching process for making the inclined planes; however, as pointed out above, the presently available etching processes are too imprecise.

Recently, semiconductor surfaces containing V-grooves have been introduced for field effect transistors (FETs). These V-grooves in field effect transistors can allow elements to be positioned in such a manner as to reduce the required space between elements which would otherwise be arranged in a parallel relationship on the semiconductor surface, i.e., to the circuit plane. With the trend toward ever increasing packing density in integrated circuits such space-saving methods are of great importance. Using existing techniques, the angle between the two legs of the V is predetermined by the orientation of specific crystal planes. This results in predetermined angle which limits the maximum depth and leg length of the groove on the semiconductor surface. If it were possible to vary the angle between the legs, the flexibility of the circuit layout would be increased considerably. With the above electrochemical etching methods of the present invention, it is possible to provide angles which will result in V-grooves having dimensions in the order of $\mu$m.

OBJECTS OF THE INVENTION

It is the object of the invention to provide an apparatus and a simple method for etching surfaces and particularly semiconductor surfaces in a manner easily controllable and in such a way that a smooth plane is obtained. The surface can be small both in size and inclination with respect to the original surface. This inclination can be precisely maintained at a reproducible angle of inclination between 0° and almost 90°.

These and other objects of the present invention will become apparent to one skilled in the art from the following description and claims.

SUMMARY OF THE INVENTION

The device and method as disclosed in this invention can be used in many ways. It is possible to etch reproducible recesses which are of very precisely defined shapes and dimensions and where the surfaces are of a very high quality. With the arrangement as disclosed by the invention, the actual etching is very simple. The complexity of the entire process is less than known methods permitting comparable results. Furthermore, the invention presents considerable advantages over existing processes.

If one of the potentials at the workpiece is the same as the cathode potential, then the surface produced during etching will be inclined and there will be no step on the surface adjacent to the electrode held at the same potential as the cathode.

It is of advantage when the area to be etched is limited by two oppositely placed and highly conductive zones. Smooth inclined planes with a constant angle of inclination over the entire plane are obtained when the limits formed by the highly conductive zones are parallel.

It is of advantage when the inventive arrangement includes for the illumination of the plane to be etched a lamp with a strong spectral distribution in the near infrared. Such an illumination enhances the etching of n-doped silicon, and particularly silicon of low n-doping. Without this illumination, the n-doped silicon does not have a hole conductivity with the consequence that the etching of n-doped silicon produces a porous material.

With the arrangement as disclosed by the invention, it is possible with less complicated apparatus to produce the same structures in semiconductor chips, as can be produced with reactive ion etching.

The method disclosed presents an alternative to the known methods for the production of bevellings on semiconductor chips doped by means of diffusion or ion implantation for the subsequent measuring of the penetration depth and of the doping profile. The method also provides an alternative for the production of V-grooves in semiconductor chips for increasing the density of semiconductor components in integrated circuits.

Furthermore, the method as disclosed by the invention has advantages over the known methods. The etched inclined planes are of a better quality with respect to the consistency of the angle of inclination than ground planes. The inclined planes made by the method of the invention can be of much smaller dimensions than those produced by grinding. It is thus possible to measure the penetration depth and the doping profile on product wafers directly, i.e., on such wafers in which integrated circuits are to be made. Measuring the product wafers as described above present the advantage that test wafers, generally processed together with the product wafers are no longer necessary, and that the measuring on the product wafer gives more precise information with regard to the process conditions. Etched planes can be made in areas of a semiconductor wafer which can subsequently be cut into chips.

The method as disclosed by the invention is more flexible than present methods, for example, the angle between the legs of the V in the known V-groove technique is precisely determined by the crystal orientation of the semiconductor wafer surface, however, in the method as disclosed by the invention, this angle can be varied to a considerable extent.

It is of advantage if in the method as disclosed by the invention an average current density (over the entire plane) of $\leq 200$ mA/cm$^2$ is maintained, since at higher current densities it is difficult to control the etching process.

Further advantageous embodiments of the arrangements and the method as disclosed by the invention are given in the claims.

The invention will be described below by means of embodiments specified by drawings.

BRIEF DESCRIPTION OF THE DRAWINGS

FIG. 1 is a schematic representation showing a cross-section view of one embodiment of the present invention.

FIG. 2A is a plan view of another embodiment of the invention as applied to a silicon wafer.

FIG. 2B is a cross section through the arrangement of FIG. 2A along line A—A showing the silicon wafer after etching.

FIG. 3A is a schematic cross-section of a body to be etched, in accordance with another embodiment of the invention in which the body is etched in several spots simultaneously.

FIG. 3B is a cross-section of the body of FIG. 3A after etching. The system of conductive lines and connections shown in FIG. 3A was used.

FIG. 3C is a cross-section of the body of FIG. 3A after etching. The system of conductive lines and connections in FIG. 3A was used with the potentials being alternatingly exchanged during etching at the conductive lines or connections.

DETAILED DESCRIPTION OF PREFERRED EMBODIMENTS

Figure 4:
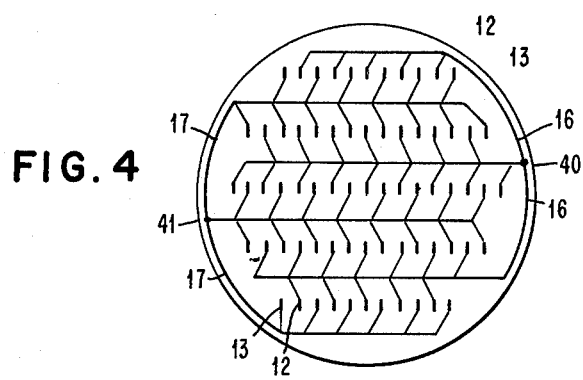
FIG. 4 is a plan view of a system of conductive lines and connections on a semiconductor wafer for selectively etching the semiconductor wafers in a plurality of spots simultaneously.

The device shown in FIG. 1 allows one to selectively etch the surface of a workpiece 1. The workpiece 1 to be etched may be a silicon or semiconductor wafer, however, the workpiece 1 need not be restricted to silicon or semiconductors but can be any conductive substances that can be etched electrochemically. The device has a vessel 2 for containing the electrolyte 3, that vessel 2 is constructed of a material which is not attacked by the electrolyte 3. A suitable material which is etch-resistant against many electrolytes, including hydrofluoric acid which is frequently used for etching silicon, is teflon. Vessel 2 has an opening 9 in its floor which is in contact with the silicon wafer 1 to be etched. The sealing between vessel 2 and silicon wafer 1 is ensured by means of a sealing ring not shown. This sealing ring may be viton which is a linear copolymer of vinylydene fluoride and hexafluoropropylene. A cathode 4 is immersed in the electrolyte 3, said cathode 4 consisting of a conductive material which is not attacked by the electrolyte 3. A material satisfying these demands in most cases is platinum. The cathode does not have to have any specific shape (e.g., it can be a thin wire). The cathode 4 is connected to a current source 7. The silicon wafer 1 via connections 5 and 6 is also conductively connected to current source 7. FIG. 1 shows the current supply in an operating state in which the cathode potential and the potential applied to connection 5 are of the same level. However, by activating the switch S (see FIG. 1) in the current supply, the current supply 7 can also be operated in such a manner that the potentials applied at cathode 4 and at connections 5 and 6 are different. For etching the contour 8 shown in FIG. 1, it is necessary to assure that the most positive potential is applied to connection 6. The region on the silicon wafer 1 to be etched may be limited by the viton ring, or a mask. This mask, not shown, is of a material that is electrically isolating and resistant to attack by the electrolyte. An alternate means for limiting the region etched is to have conductive lines 12 and 13 shown in FIG. 2A connected to silicon wafer 1 and be anodic. The highly conductive lines 12 and 13 and the spots by which connections 5 and 6 are connected to the semiconductor wafer are made preferably of an etch-resistant material, such as gold.

When the potentials at the cathode 4 and connections 5 and 6 are different, material is removed during etching over the surface exposed to the electrolyte. A greater amount of material is removed at the side with the more positive potential, and the smaller amount of material is removed at the side with the less positive potential. As there is a voltage drop between the applied potentials within the surface to be etched the removal increases linearly between the point of the highest and the point of the lowest applied potential. The result of the etching is a plane which slopes linearly with respect to the original silicon surface.

If the cathode 4 has a potential which is the same as one of the other potentials at the silicon wafer, there will be no removal of material at the point of where the potential equals that of the cathode. In this manner, a linearly sloping plane is obtained, with there being no step between the original silicon surface and the linearly sloping plane. This is not the case when the three potentials are different. If the cathode potential and one of the potentials at the silicon wafer are on the same level the angle of inclination of the linearly sloping plane is determined exclusively by the quantity of the material removed.

For etching silicon, hydrofluoric acid can be used as an electrolyte. Particularly good results are obtained with approximately 5% by weight hydrofluoric acid solution and etching at room temperature. With silicon, average current densities of about $\leq 200$ mA/cm$^2$ give positive results, i.e., planes of uniform angle of inclination and high surface quality. With a current density of more than 200 mA/cm$^2$, the etching could no longer be reliably controlled. With a current density of 200 mA/cm$^2$ and a plane to be etched of 0.5 cm$^2$, the etching speed of silicon is 0.064 $\mu$m per second. As the recesses to be etched frequently have depths in the order of 1 $\mu$m, they require etching times in the order of 15 seconds. Since the etching depth is a function of the etching duration, it is difficult reproducibly to make recesses of a predetermined depth if the current is switched on once and off again after 10 to 15 seconds, for this reason pulsed etching is used. With the required current, the pulses can take between 0.1 and 1.5 seconds. Pulsed etching also avoids excessive heating of the electrolyte during the etching process.

When silicon of low n-doping is etched, the plane to be etched has to be exposed to light with a high portion of infrared radiation. This infrared irradiation is necessary with the n-doped silicon and not with the p-doped silicon because the portion of holes in the n-doped silicon available is too small to ensure homogeneous removal of material with a predetermined current density. The lack of holes is compensated for by the radiation. To ensure that the lamp has the desired effect, the portion of the light spectrum whose wavelengths corresponds to an energy that is slightly lower than the band gap must be of high intensity. The band gap of silicon is at approximately 1.1 eV which corresponds to a wavelength of approximately 1.3 $\mu$m.

The device of FIG. 1 can be used for making bevelled surfaces on test wafers which have been processed together with the product wafers for the purpose of characterizing the doping operations. If the silicon wafer 1 in FIG. 1 is a test wafer into which the dopants have been diffused, the inclined plane made by the apparatus and method of this invention can be used by applying known staining methods for measuring the penetration depth, and by means of spotwise measurement of the resistance along the line of steepest gradient for measuring the doping profile.

FIG. 2A shows a plan view of sections of two conductive lines 12 and 13 on surface 11 of a silicon wafer. In the area between the two conductive lines 12 and 13, a drop of electrolyte such as aqueous hydrofluoric acid is applied in such a manner that it contacts the two conductive lines 12 and 13. Into the drop of electrolyte a platinum wire 15 is immersed. If the conductive lines 12 and 13, and the platinum wire 15 are connected to a current supply in such a manner that the platinum wire 15 is made the cathode, conductive line 13 is on the same potential as the cathode, and conductive line 12 is positive with respect to the cathode 15; then the silicon between conductive lines 12 and 13 is etched at a rate that increases linearly, between conductive lines 13 and 12, with the etching rate being zero directly adjacent to conductive line 13. This result is represented by FIG. 2B which shows a cut through the arrangement of FIG. 2A along line A—A. FIG. 2B shows that a linearly inclined profile is obtained on the silicon wafer section which consists of a p-doped substrate on which an n-doped, a p-doped and finally another n-doped silicon layer have been applied successively. These layers can be epitaxially grown.

Using the arrangement shown in FIG. 2A, it is possible to etch a very small area such as portions of a semiconductor wafer. The etched wafer may then be cut into chips.

Tests have confirmed that the removal of silicon in electrochemical etching in an aqueous hydrofluoric acid depends only on the transferred charge and not on the conductivity type and doping concentration. Table I gives the results of 9 tests and lists conductivity type, the doping concentration, their etching conditions, and the results obtained therewith. For all samples the material was removed parallel to the original semiconductor surface.

TABLE I

| Test Number | Conductivity Type | Dopant Concentration atom/cm³ | Transferred Charge in A sec | Etching Depth in μm | Removed Volume/A sec (mm³/A sec) | Conditions | Remarks |
| --- | --- | --- | --- | --- | --- | --- | --- |
| 1 | n | $10^{17}$ | $6.51 \cdot 10^{-3}$ | 0.36 | $2.82 \cdot 10^{-2}$ | with illum., pulsed etching | removal homogeneous |
| 2 | n | $2 \cdot 10^{17}$ | $7.8 \cdot 10^{-3}$ | 0.48 | $3.19 \cdot 10^{-2}$ | with illum., pulsed etching | removal homogeneous |
| 3 | n | $10^{18}$ | $2.86 \cdot 10^{-3}$ | 0.19 | $3.38 \cdot 10^{-2}$ | with illum., pulsed etching | removal homogeneous |
| 4 | n | $10^{18}$ | $4.03 \cdot 10^{-3}$ | 0.23 | $2.91 \cdot 10^{-2}$ | with illum., pulsed etching | removal homogeneous |
| 5 | n | $10^{20}$ | $8.24 \cdot 10^{-3}$ | 0.54 | $3.34 \cdot 10^{-2}$ | with illum., pulsed etching | removal homogeneous |
| 6 | p | $10^{17}$ | $6.08 \cdot 10^{-3}$ | 0.39 | $3.27 \cdot 10^{-2}$ | with illum., pulsed etching | removal homogeneous |
| 7 | p | $10^{18}$ | $10.85 \cdot 10^{-3}$ | 0.70 | $3.29 \cdot 10^{-2}$ | with illum., pulsed etching | removal homogeneous |
| 8 | p | $10^{20}$ | $1.97 \cdot 10^{-3}$ | 0.12 | $3.10 \cdot 10^{-2}$ | without illumin. | removal homogeneous |
| 9 | n | $10^{18}$ | * | * | * | without illumin. | homogeneous rough surface |

* Measuring Impossible

In each case, an area of 0.5 mm² was etched. For all tests the current densities were between 50 and 150 mA/cm². For illumination, a halogen infrared radiation reflector, Osram No. 64 635, was used. The spectrum from this light source satisfies the requirements set forth above. The etching speed variations given in the table are within the ±0.3 μm measuring accuracy of the thickness measuring device used.

FIGS. 3A to 3C illustrate how the method and apparatus can be used to generate a plurality of recesses. These recesses can have either an inclined etched surface 18 which is inclined with respect to the original surface 11 (FIG. 3B); or etched surfaces 19 parallel to the original surface 11 (FIG. 3C). FIG. 3A shows a cross-section of semiconductor wafer 10. On surface 11 conductive lines 12 and 13 are applied parallel to each other bounding those regions to be etched. FIG. 3A schematically shows connections 16 and 17. Connection 16 connects conductive line 12 to the current supply, not shown, while connection 17 connects conductive lines 13 to the power supply. Connections 16 and 17 can be in the same plane as conductive lines 12 and 13, or in a plane above. The connections 16 and 17 can be separated by an insulating layer from the plane of conductive lines 12 and 13. The conductive lines 12 and 13 should be made of a material which is subject to only limited attack by the hydrofluoric acid, such as gold, and/or can be protected against the etching attack of the hydrofluoric acid by means of a passivating layer consisting of an oxide, silicon nitride, or photoresist.

For etching, semiconductor wafer 10 is preferably prepared as follows. In the case where conductive lines 12 and 13, and connections 16 and 17 are to be in the same plane, the conductive lines 12 and 13 and the connections 16 and 17 are generated on the surface 11 of the semiconductor 10 by means of any known methods, e.g., blanket vapor depositions of the conductive line material and subsequent subtractive etching, or by means of the lift-off process. Subsequently, a layer of the insulating material that is resistant to hydrofluoric acid, is applied over the entire surface. The insulating material is removed photolithographically where the semiconductor material is to be etched, and is removed for contact holes for connections 16 and 17 if such contact holes are required.

Over the semiconductor body 10, which has been prepared as described above, a vessel such as is shown in FIG. 1, is placed. The vessel has an opening in the bottom which is of sufficient size that the portion of the semiconductor wafer 10 which is to be etched is exposed to the etchant. As pointed out in the discussion of FIG. 1, the seal between the vessel and semiconductor wafer 10 can be effected by means of a Viton ring. Connections 16 and 17 can pass beneath the Viton ring. The vessel is filled with a solution which is approximately 5% hydrofluoric acid by weight. A platinum wire which serves as a cathode is immersed into the hydrofluoric acid. To generate the profile shown in FIG. 3B, the platinum wire and connection 16, and thus the conductive lines 12 are of the same potential, while connection 17 and thus conductive line 13 are of a potential that is more positive. The structure shown in FIG. 3B is obtained after a predetermined number of etching pulses and after the removal of conductive lines 12 and 13, and of connections 16 and 17. The resulting recesses 18 are inclined as illustrated in FIG. 3B.

The structure shown in cross-section in FIG. 3C, with recesses 19 having a horizontal etched profile, is obtained by either applying to connections 16 and 17 the same potential, this potential being more positive than the cathode, or by having different potentials applied to connections 16 and 17, and altering the pulse applied to connections 16 and 17 with each etching pulse.

One possible arrangement of the conductive lines 12 and 13, and the connections 16 and 17 is shown in FIG. 4. The semiconductor wafer is masked in such a manner that only the areas between adjacent conductive lines 12 and 13 are exposed to the etchant. The semiconductor wafer is connected to the current supply (not shown) by connections 40 and 41.

Figure 5A:
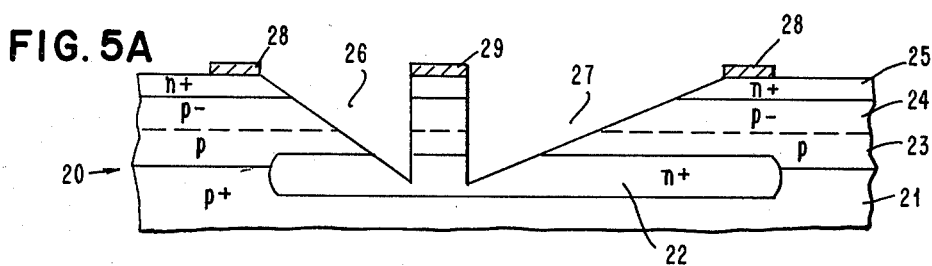
FIG. 5A is a cross-section through a semiconductor wafer showing different doped layers. The wafer was etched in accordance with the method of the invention.
Figure 5B:
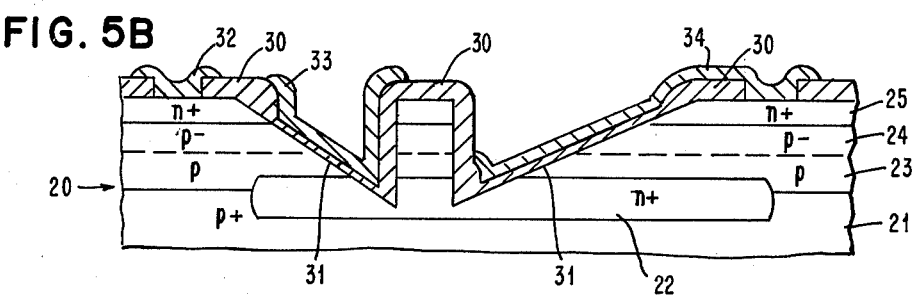
FIG. 5B is the same cross-section as in FIG. 5A after a number of further process steps have been executed at the semiconductor wafer, an inverter with field effect transistors and the necessary conductive lines having been produced by means of these steps.
Figure 5C:
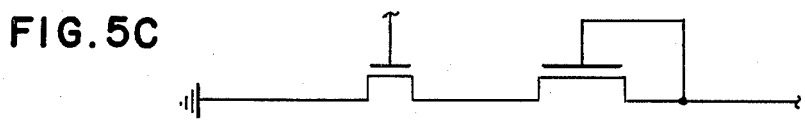
FIG. 5C is the equivalent circuit diagram of the inverter of FIG. 5B.

The manner in which the method of the present invention can be applied to the production of densely packed integrated circuit components is described in connection with FIGS. 5A and 5C. FIG. 5A shows a cross-section of a silicon wafer 20 having a p⁺-doped substrate 21 in which an n⁺-doped area 22 is produced by means of diffusion, and on which a p-doped epitaxial layer 23 and a p⁻-doped epitaxial layer 24 has been grown. A portion of the doping material in area 22 has been incorporated in the epitaxial layer 23. By means of a known doping process, such as diffusion or ion implantation, the upper portion of the epitaxial layer 24 was converted into an n⁺-doped layer 25. By means of known methods, conductive lines 28 and 29 have been applied to the semiconductor surface. Recesses 26 and 27 were etched by the method of the invention. The silicon surface was exposed to an acid solution of approximately 5% by weight hydrofluoric. The same voltage was applied to conductive lines 28 as to the cathode. A potential more positive by approximately 30 V than the cathode was applied to conductive line 29.

In recess 27 the inclined plane is longer than the inclined plane in recess 26. This is achieved in that conductive lines 28 and 29 are applied in such a manner that the conductive lines limiting recess 27 are provided at a greater distance from each other than the conductive lines limiting recess 26.

Since conductive line 29 limits recess 27 and recess 26 and the same positive potential is applied at both planes, both recesses go to the same depth. The inclined plane in recesses 26 and 27 thus reaches from n⁺-doped layer 25 to n⁺-doped area 22. After the removal of conductive lines 28 and 29 a thermal oxidation took place, with a thick oxide layer 30 being formed in the process. Subsequently, windows to n⁺-doped layer 25 were made in the oxide layer 30, and furthermore an opening was etched in the recesses in such a manner that the inclined planes in the p-doped area were exposed. Subsequently, thin oxide layers 31 were grown in the openings in recesses 26 and 27, and finally the contacts or lines 32, 33 and 34 were made by means of known methods. Thus, the obtained structure is shown in FIG. 5B in cross-section. This circuit is an inverter. An essential feature of an inverter is that the one field effect transistor has a higher channel resistance than the other. With the method as disclosed by this invention, it is possible to satisfy this demand in those cases where the channels extend along inclined planes in that inclined planes with different angles of inclination and consequently different channel lengths are required. Using the known V-groove technique referred to above, it is more difficult to produce field effect transistors containing grooves with different channel resistances.

The apparatus and method of the present invention can be used in the manufacture of miniaturized components, such as in the production of ink jet printer nozzles and recesses used for insulating semiconductor components from each other.

Since the recesses used to insulate semiconductor components have vertical walls, it is possible to establish more uniform $SiO_2$ films when the resulting structure is subject to thermal oxidation. This eliminates anomolies in thickness of the oxides. These anomolies are referred to as "bird's beak". A further discussion of the "bird's beak" problem is contained in the Magdo et al patent (U.S. Pat. No. 4,002,521) assigned to the assignee of the present application.

EXAMPLE

With an arrangement as represented in FIG. 1, and by means of the method of the invention, a 0.5 $cm^2$ plane of a silicon wafer was etched. The silicon wafer was homogeneously doped with a p-type impurity to a dopant concentration of approximately $7 \cdot 10^{14}$ atoms/$cm^3$. Onto the round silicon wafer a thin gold layer had been applied in the form of two segments.

The two gold segments had two secants parallel to each other and spaced at a distance equal to the length of the plane to be etched. An electrolyte 5% by weight hydrofluoric acid was used. Differing voltages were applied to the gold segments, one voltage equalling the cathode potential and the other being more positive than the cathode potential. Pulsed etching was used. During the etching pulses an average current density of 200 mA/$cm^2$ over the plane to be etched was maintained, with a current voltage of up to 100 V being required between the cathode and anode. The etching pulses were one second long. After approximately 3300 etching pulses, a plane linearly inclined vertically to the secants of the gold segments was obtained with an angle of inclination of 6° relative to the original surface. The inclined plane showed a very high surface quality.

Having thus described our invention, what we claim as new, and desire to secure by Letters Patent is:

1. In an apparatus for selectively electrochemically etching the surfaces of a workpiece, the apparatus having a cathode, a current supply for connecting the cathode and the workpiece such that the workpiece is anodic with respect to the cathode, the improvement comprising:
   multiple connectors adapted to connect the workpiece to the current supply,
   means for maintaining said connectors at predetermined potentials which can be set so that the cathode is at least as negative as the lowest potential of said connectors, and
   a walled vessel having a hole in said vessel's walls, said hole being positioned so that the surface of the workpiece may be placed adjacent to said hole while maintaining contact with the electrolyte.

2. The apparatus of claim 1 wherein said connectors are gold.

3. The apparatus of claim 1 wherein the workpiece is a semiconductor and which further comprises an infrared light source which illuminates the surface of the workpiece to be etched.

4. An improved method for electrochemically etching the surface of a workpiece where the etching is accomplished by transfer of material from the workpiece into the electrolyte which is in contact with a cathode, the improvement comprising:
   maintaining a gradient in the potential of the surface of the workpiece,
   said gradient being maintained by applying multiple contacts to the surface of the workpiece and maintaining said contacts at predetermined potentials which are set so that the cathode is at least as negative as the lowest potential of said contact, and
   said maximum potential between the cathode and any of said contacts being 100 V.

5. The method of claim 4 wherein the average current density between the cathode and the workpiece is maintained at less than about 200 mA/$cm^2$.

6. The method of claim 5 wherein said current is pulsed and the duration of said pulses is between about 0.1 and 1.5 seconds.

7. The method of claim 4 wherein said contacts are gold deposits on the surface.

8. The method of claim 4 wherein the surface of the workpiece to be etched is irradiated with near infrared light during etching.

9. The method of claim 8 wherein the workpiece is a semiconductor.

10. The method of claim 9 wherein the semiconductor is from the group of intrinsic silicon, p-doped silicon, n-doped silicon, germanium, and gallium arsenide.

11. The method of claim 10 wherein the workpiece is silicon and the electrolyte contains between about 2% and 10% by weight hydrofluoric acid.

* * * * *